US009800181B2

(12) United States Patent
Jun et al.

(10) Patent No.: US 9,800,181 B2
(45) Date of Patent: Oct. 24, 2017

(54) HYBRID DIODE DEVICE

(71) Applicant: ELECTRONICS AND TELECOMMUNCATIONS RESEARCH INSTITUTE, Daejeon (KR)

(72) Inventors: Chi Hoon Jun, Daejeon (KR); Sang Choon Ko, Daejeon (KR); Minki Kim, Daejeon (KR); Jeho Na, Seoul (KR); Young Rak Park, Daejeon (KR); Junbo Park, Seoul (KR); Hyun Soo Lee, Goyang-si (KR); Hyung Seok Lee, Daejeon (KR); Hyun-Gyu Jang, Cheongju-si (KR); Dong Yun Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/299,519

(22) Filed: Oct. 21, 2016

(65) Prior Publication Data

US 2017/0141704 A1    May 18, 2017

(30) Foreign Application Priority Data

Nov. 13, 2015  (KR) .................. 10-2015-0159871
May 31, 2016  (KR) .................. 10-2016-0067678

(51) Int. Cl.
*H02N 2/18* (2006.01)
*H01L 41/113* (2006.01)
(Continued)

(52) U.S. Cl.
CPC ......... *H02N 2/186* (2013.01); *H01L 29/2003* (2013.01); *H01L 29/205* (2013.01);
(Continued)

(58) Field of Classification Search
CPC .......... H01L 41/113–41/1138; H01L 41/1132; H01L 41/0926; H01L 41/0933;
(Continued)

(56) References Cited

U.S. PATENT DOCUMENTS

| 8,541,818 B2 | 9/2013 | Wu et al. |
| 2006/0076855 A1* | 4/2006 | Eriksen .................. G01L 9/0042 310/344 |

(Continued)

FOREIGN PATENT DOCUMENTS

| KR | 10-2012-0074556 A | 7/2012 |
| KR | 10-2013-00238010 A | 3/2013 |

OTHER PUBLICATIONS

Marco Ferrari et al., "Piezoelectric multifrequency energy converter for power harvesting in autonomous microsystems", Sensors and Actuators A, vol. 142, No. 1, Mar. 10, 2008, pp. 329-335.

(Continued)

*Primary Examiner* — Evan Pert
*Assistant Examiner* — Changhyun Yi
(74) *Attorney, Agent, or Firm* — Rabin & Berdo, P.C.

(57) ABSTRACT

Provided is a hybrid diode device. The hybrid diode device includes a first lower nitride layer disposed on a substrate and including a first 2-dimensional electron gas (2DEG) layer, a second lower nitride layer extending from the first lower nitride layer to the outside of the substrate and including a second 2DEG layer, a first upper nitride layer disposed on the first lower nitride layer, a second upper nitride layer disposed on the second lower nitride layer, a first cap layer disposed on the first upper nitride layer, a second cap layer disposed on the second upper nitride layer, a first electrode structure connected to the first lower nitride layer and the first cap layer; and a second electrode structure connected to the second lower nitride layer and the first
(Continued)

electrode structure. The second lower nitride layer generates electric energy through dynamic movement.

20 Claims, 7 Drawing Sheets

(51) Int. Cl.
H01L 29/872 (2006.01)
H01L 29/84 (2006.01)
H01L 29/20 (2006.01)
H01L 29/205 (2006.01)

(52) U.S. Cl.
CPC ............ H01L 29/84 (2013.01); H01L 29/872 (2013.01); H01L 41/1136 (2013.01)

(58) Field of Classification Search
CPC . H01L 41/094; H01L 41/0973; H01L 41/047; G01L 9/0055; G01L 9/0042; Y10T 29/4908

USPC ........ 73/724; 438/49; 310/344; 257/301, 415
See application file for complete search history.

(56) References Cited

U.S. PATENT DOCUMENTS

| 2006/0217776 A1 | 9/2006 | White et al. |
| 2009/0174014 A1* | 7/2009 | Kunze .................. B81B 3/0024 257/415 |
| 2011/0140579 A1 | 6/2011 | Moon et al. |
| 2013/0049539 A1 | 2/2013 | Lee et al. |
| 2014/0183669 A1* | 7/2014 | Xu ..................... G01C 19/5656 257/415 |

OTHER PUBLICATIONS

Ting-Fu Chang et al., "Low Turn-on voltage dual metal AlGaN/GaN Schottky barrier diode", Solid-State Electronics, vol. 105, Mar. 2015, pp. 12-15.

* cited by examiner

HYBRID DIODE DEVICE

CROSS-REFERENCE TO RELATED APPLICATIONS

This U.S. non-provisional patent application claims priority under 35 U.S.C. §119 of Korean Patent Application Nos. 10-2015-0159871, filed on Nov. 13, 2015, and 10-2016-0067678, filed on May 31, 2016, the entire contents of which are hereby incorporated by reference.

BACKGROUND

The present disclosure herein relates to a hybrid diode device, and more particularly, to a hybrid diode device in which a piezoelectric device and a diode device are integrated on one substrate.

Generally, electronic devices require a battery or a fixed power source as an operating power source. Particularly, the battery is required to be replaced according to periodic recharging or its lifetime. Recently, as electronic devices are developed in wireless and low-power types, energy harvesting-type micro power generators, which harvest electric energy from surrounding environments, are being studied.

Also, to supply the electric energy, which is generated by converting the surrounding environment energy, to electronic devices actually requiring the power as described above, a rectifier device that converts the generated electric energy having a predetermined waveform into direct current or a rectifier circuit component combined therewith are additionally required.

SUMMARY

The present disclosure provides a hybrid diode device in which a piezoelectric device and a diode device are integrated on one substrate. Thus, a self-power providing hybrid diode device may be provided.

The present disclosure also provides a hybrid diode device including a piezoelectric device and a diode device, which share a gallium nitride-based nitride layer formed of a piezoelectric material.

The present disclosure also provides a diode device capable of converting alternating current-type electric energy provided by a piezoelectric device into direct current-type electric energy.

An embodiment of the inventive concept provides a hybrid diode device including: a first lower nitride layer disposed on a substrate and including a first 2-dimensional electron gas (2DEG) layer; a second lower nitride layer extending from the first lower nitride layer to the outside of the substrate and including a second 2DEG layer; a first upper nitride layer disposed on the first lower nitride layer; a second upper nitride layer disposed on the second lower nitride layer; a first cap layer disposed on the first upper nitride layer; a second cap layer disposed on the second upper nitride layer; a first electrode structure connected to the first lower nitride layer and the first cap layer; and a second electrode structure connected to the second lower nitride layer and the first electrode structure, wherein the second lower nitride layer generates electric energy through dynamic movement.

In an embodiment, the first 2DEG layer may be spaced apart and electrically insulated from the second 2DEG layer.

In an embodiment, each of the first and second lower nitride layers may include gallium nitride (GaN) as a gallium nitride-based material.

In an embodiment, the second upper nitride layer may include nitride layer patterns exposing a portion of the second lower nitride, and the second 2DEG layer is provided on an area on which the second lower nitride layer contacts the nitride layer patterns.

In an embodiment, the second 2DEG layer may be discontinuously provided on an interface between the second lower nitride layer and the second upper nitride layer in a first direction, and the first direction may be perpendicular to a direction that is directed from the second upper nitride layer toward the second lower nitride layer.

In an embodiment, the second electrode structure may pass through each of the nitride layer patterns to contact the second 2DEG layer.

In an embodiment, the first electrode structure may include: a first electrode electrically connected to the first 2DEG layer in the first lower nitride layer; and a second electrode connected to the first cap layer, and a second electrode structure may include a third electrode and a fourth electrode, which are electrically connected to the second 2DEG layer in the second lower nitride layer.

In an embodiment, each of the first electrode, the third electrode, and the fourth electrode may be an ohmic electrode, and the second electrode may be a Schottky electrode, wherein the third electrode is connected to the second electrode through a connection pad, and the first electrode and the fourth electrode are connected to an external circuit.

In an embodiment, the first electrode may be an ohmic electrode that is provided in plurality, and the second electrode may be a Schottky electrode that is provided in plurality, wherein the first electrodes and the second electrodes constitute a bridge circuit.

In an embodiment, the first electrodes may include a first ohmic electrode, a second ohmic electrode, a third ohmic electrode, and a fourth ohmic electrode, the second electrodes may include a first Schottky electrode, a second Schottky electrode, a third Schottky electrode, and a fourth Schottky electrode, and a pair of first ohmic electrode and first Schottky electrode, a pair of second ohmic electrode and second Schottky electrode, a pair of third ohmic electrode and third Schottky electrode, and a pair of fourth ohmic electrode and fourth Schottky electrode may constitute first to fourth diodes, respectively.

In an embodiment, an isolation area may be provided between the first to fourth diodes to respectively divide the first to fourth diodes into each other.

In an embodiment, the first diode and the fourth diode may be connected to the third electrode through a first connection pad, the second diode and the third diode may be connected to the fourth electrode through a second connection pad, and the first diode and the second diode, and the third diode and the fourth diode may be connected to an external circuit through a third connection pad and a fourth connection pad, respectively.

In an embodiment of the inventive concept, a hybrid diode device includes: a substrate including a body part and a cantilever; a lower nitride layer disposed on the substrate and including a 2-dimensional electron gas (2DEG) layer; an upper nitride layer disposed on the lower nitride layer; a first isolation area configured to divide the 2DEG layer into a first 2DEG layer and a second 2DEG layer and divide the upper nitride layer into a first upper nitride layer and a second upper nitride layer; a first electrode structure connected to the first 2DEG layer and the first upper nitride layer; and a second electrode structure connected to the second 2DEG layer, wherein the second 2DEG layer and the second upper nitride layer are disposed on the cantilever, and the second electrode structure transfers electric energy, which is generated by a change of strain applied to the lower nitride layer, to the first electrode structure.

In an embodiment, the first isolation area may be recessed from the upper nitride layer toward the lower nitride layer.

In an embodiment, the hybrid diode device may further include a connection pad disposed on the first isolation area, wherein the connection pad connects the first electrode structure to the second electrode structure.

In an embodiment, the hybrid diode device may further include a second isolation area which is recessed from the first upper nitride layer toward the first 2DEG layer to divide each of the first 2DEG layer and the first upper nitride layer into four parts, wherein the first electrode structure includes a pair of ohmic electrode and Schottky electrode, which are respectively connected to the divided first 2DEG layers and the divided first upper nitride layers.

In an embodiment, the pair of ohmic electrode and Schottky electrode, which constitutes one diode, may be provided in four, and the ohmic electrodes and the Schottky electrodes may constitute a bridge circuit.

In an embodiment, the hybrid diode device may further include a cap layer disposed on a top surface of the upper nitride layer, wherein the cap layer is divided by the first isolation area and the second isolation area.

In an embodiment, the hybrid diode device may further include a passivation layer disposed on a top surface of the cap layer.

In an embodiment, the hybrid diode device may further include a peripheral isolation area on edges of the lower nitride layer and the upper nitride layer, which is recessed in a direction that is directed from the upper nitride layer to the lower nitride layer.

In an embodiment, the hybrid diode device may further include a proof mass disposed on an edge of the cantilever facing the substrate, wherein an opened space in which the cantilever is movable is provided below the cantilever.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
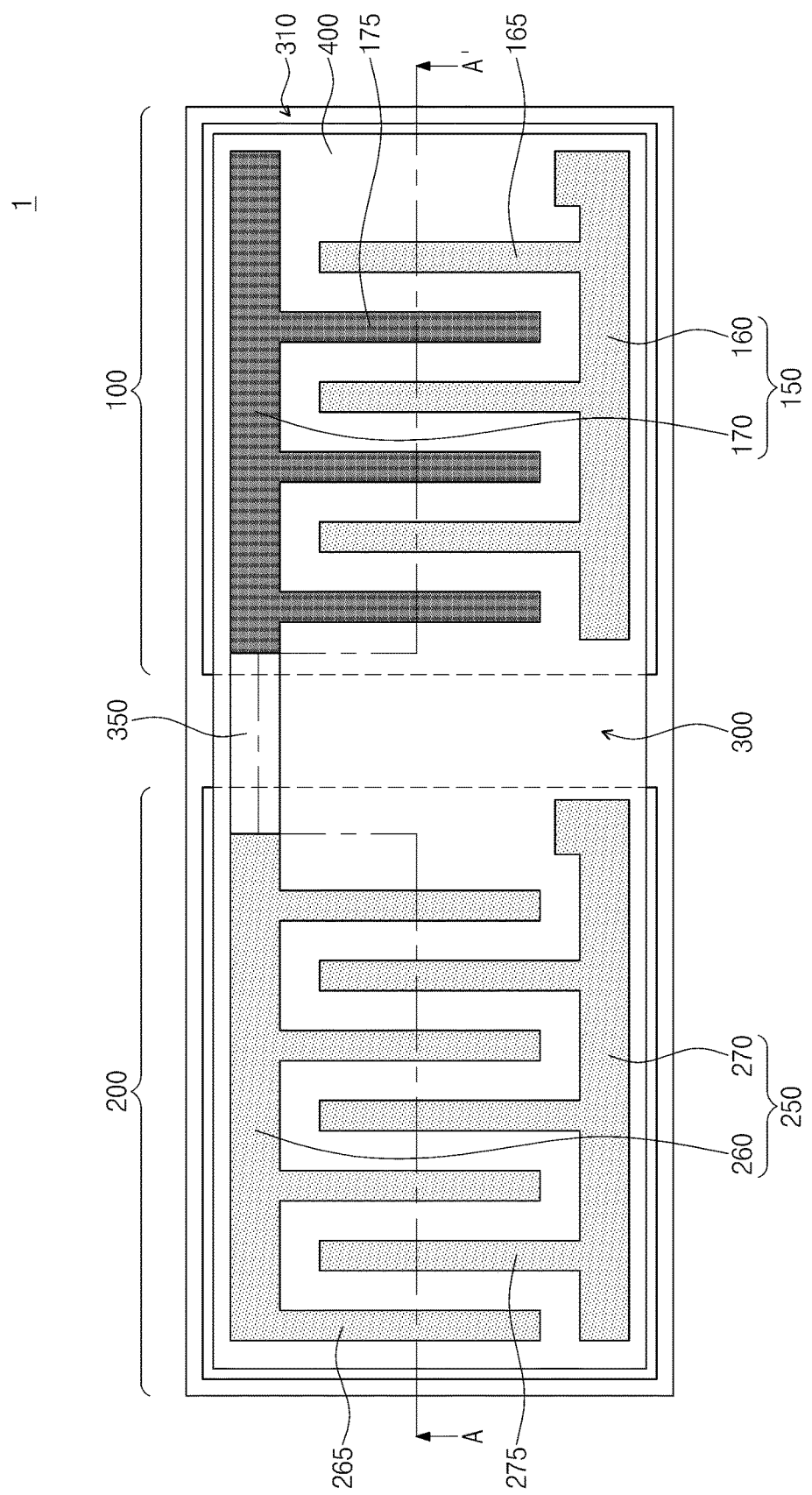
FIG. 1 is a plan view of a hybrid diode device according to an embodiment of the inventive concept.

Advantages and features of the present disclosure, and implementation methods thereof will be clarified through following embodiments described with reference to the accompanying drawings. However, the present disclosure may be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Like reference symbols refer to like elements throughout.

Additionally, the embodiments described in this specification will be explained with reference to the cross-sectional views and/or plan views as ideal exemplary views of the present disclosure. In the figures, the thicknesses of layers and regions are exaggerated for effective description of the technical contents. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated as a right angle may have rounded or predetermined curved features. Therefore, areas exemplified in the drawings have general properties, and shapes of areas exemplified in the drawing are used to illustrate a specific shape of a device region. Thus, this should not be construed as limited to the scope of the present disclosure.

Figure 2:
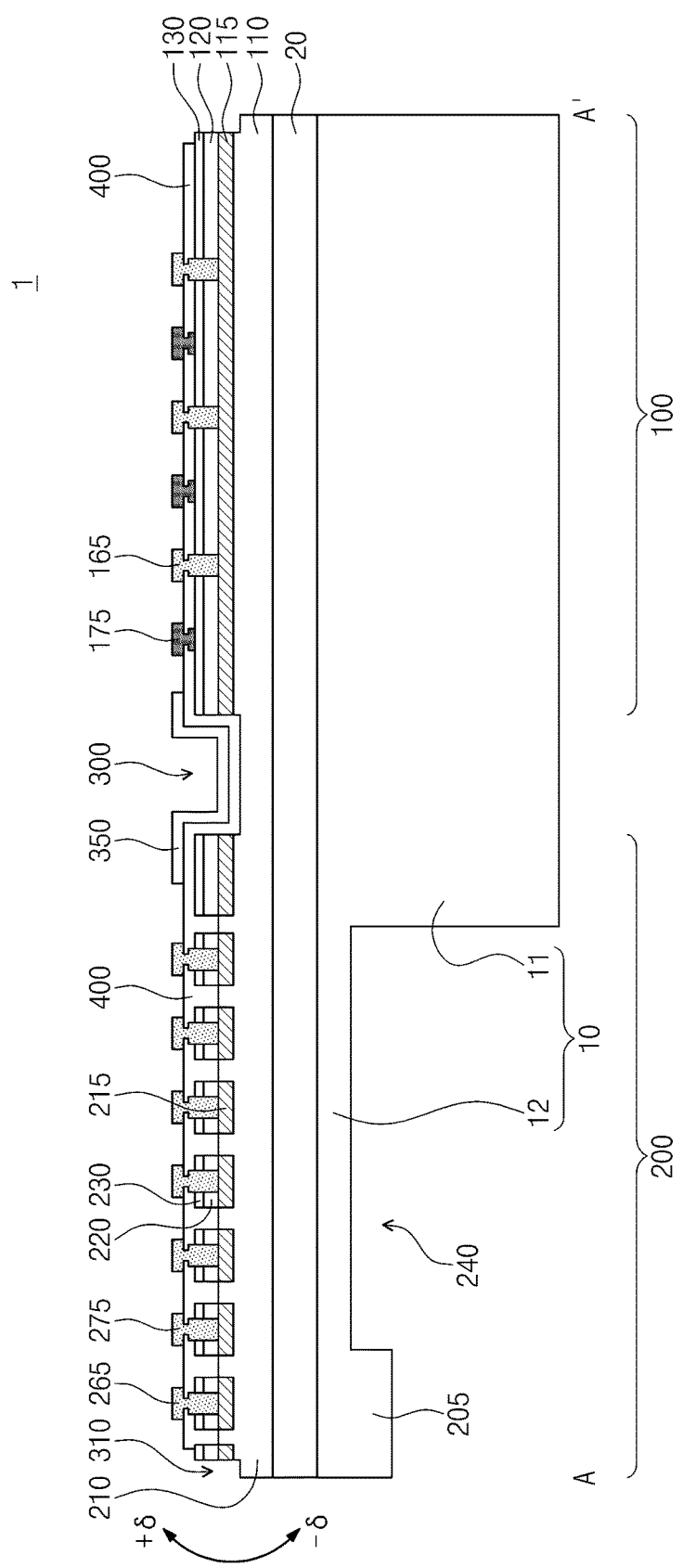
FIG. 2 is a cross-sectional view taken along line A-A' of FIG. 1.

FIG. 1 is a plan view of a hybrid diode device according to an embodiment of the inventive concept, and FIG. 2 is a cross-sectional view taken along line A-A' of FIG. 1.

Referring to FIGS. 1 and 2, a hybrid diode device 1 may include a diode device 100 and a piezoelectric device 200. The diode device 100 may be electrically connected to the piezoelectric device 200. The piezoelectric device 200 may generate electric energy by environmental changes such as vibration and pressure variation. For example, the piezoelectric device 200 may vibrate at a frequency of several Hz to several tens of kHz. The diode device 100 may rectify and convert alternating current-type electric energy generated by the piezoelectric device 200 into direct current-type electric energy. For example, the diode device 100 may perform half-wave rectification in which reverse current of alternating current electric energy generated by the piezoelectric device 200 is blocked, and only forward current flows. The diode device 100 and the piezoelectric device 200 may be disposed on a substrate 10. For example, the substrate 10 may include one of sapphire, silicon, gallium nitride (GaN), and silicon carbide (SiC). The substrate 10 may include a body part 11 on which the diode device 100 is disposed and a cantilever 12 on which the piezoelectric device 200 is disposed. The cantilever 12 may have a thickness less than that of the body part 11. Thus, the cantilever 12 having an end fixed to the body part 11 may vibrate. A thickness of the cantilever 12 may be determined according to a thickness thereof to be etched. For example, the body part 11 may have a thickness of several tens of μm to several mm, and the cantilever 12 may have a thickness of several μm to several tens μm. A passivation layer 400 may be provided on the diode device 100 and the piezoelectric device 200 to protect the diode device 100 and the piezoelectric device 200. The hybrid diode device 1 may be embedded in a package (not shown) or a can (not shown) for protecting the hybrid diode device 1 against external environments.

The diode device 100 may include a first lower nitride layer 110, a first upper nitride layer 120, a first cap layer 130, and a first electrode structure 150. The first lower nitride layer 110 may contact the substrate 10. The first lower nitride layer 110 may include gallium nitride (GaN). A first 2-dimensional electron gas (2DEG) layer 115 may be provided in the first lower nitride layer 110. The first 2DEG layer 115 may function as a channel through which current flows because electron gas having high density exists in the first 2DEG layer 115. A buffer layer 20 may be disposed between the substrate 10 and the first lower nitride layer 110. The buffer layer 20 may be defined as a portion of the substrate 10. The buffer layer 20 may compensate a difference in lattice constant between the substrate 10 and the first lower nitride layer 110.

The first upper nitride layer 120 may be disposed on the first lower nitride layer 110. The first upper nitride layer 120 may form a heterojunction structure with the first lower nitride 110. The first upper nitride layer 120 may include aluminum gallium nitride (AlGaN).

The first cap layer 130 may be disposed on the first upper nitride layer 120. The first cap layer 130 may include gallium nitride (GaN), indium gallium nitride (InGaN), or aluminum nitride (AlN). The first cap layer 130 may be a single layer or a composite layer constituted by the above-described several kinds of layers. Also, the first cap layer 130 may reduce leakage current through a surface of the first upper nitride layer 120. According to an embodiment, an electrical insulation layer such as alumina ($Al_2O_3$), silicon oxide ($SiO_2$), silicon nitride ($Si_3N_4$) or hafnium oxide ($HfO_2$) may be additionally disposed on the first cap layer 130.

The passivation layer 400 may be disposed on the first cap layer 130. The passivation layer 400 may protect the diode device 100.

The first electrode structure 150 may include a first electrode 160 and a second electrode 170. The first electrode 160 may pass through the first upper nitride layer 120 and the first cap layer 130 to directly contact the first lower nitride 110. Since the first 2DEG layer 115 is disposed on an interface between the first upper nitride layer 120 and the first lower nitride layer 110, the first electrode 160 may directly contact the first 2DEG layer 115. The second electrode 170 may pass through the passivation layer 400 to directly contact the first cap layer 130. The first electrode 160 and the second electrode 170 may be spaced apart from each other. The first electrode 160 may be an ohmic electrode ohmic-contacting the first 2DEG layer 115, and the second electrode 170 may be a Schottky electrode Schottky-contacting the first cap layer 130. The ohmic electrode may be a cathode, and the Schottky electrode may be an anode. The first electrode 160 and the second electrode 170 may constitute a diode. For example, the anode may include nickel (Ni) or gold (Au), and the cathode may be an alloy including at least one of nickel (Ni), gold (Au), aluminum (Al), titanium (Ti) or molybdenum (Mo). The first electrode 160 may have an end connected to an external circuit, and the second electrode 170 may have an end electrically connected to the piezoelectric device 200.

The first electrode 160 and the second electrode 170 may respectively have a plurality of first extension parts 165 and second extension parts 175, which are exposed on the passivation layer 400. The first extension parts 165 may extend toward the second electrode 170, and the second extension parts 175 may extend toward the first electrode 160. The first extension parts 165 and the second extension parts 175 may be alternately disposed in one direction. The first extension parts 165 and the second extension parts 175 may be spaced apart from each other.

The piezoelectric device 200 may include a second lower nitride layer 210, a second upper nitride layer 220, a second cap layer 230, and a second electrode structure 250.

The second lower nitride layer 210 may be connected to the first lower nitride layer 110. The second lower nitride layer 210 may extend from the first lower nitride layer 110 to the outside of the substrate 10. The second lower nitride layer 210 may include gallium nitride (GaN). A second 2-dimensional electron gas (2DEG) layer 215 may be provided in the second lower nitride layer 210. The second 2DEG layer 215 may function as a channel through which current flows because electron gas having high density exists in the second 2DEG layer 215. The second lower nitride layer 210 may function as a piezoelectric material. Dynamic movement of the cantilever 12 may be induced by environmental changes such as vibration and pressure variation, and then a change of strain may be applied to the second lower nitride layer 210. Accordingly, electric energy may be generated by piezoelectric conversion in the second lower nitride layer 210, and the generated electric energy may be transferred to the second electrode structure 250 by the second 2DEG layer 215.

The buffer layer 20 may be disposed on a bottom surface of the second lower nitride layer 210. The buffer layer 20 may support the second lower nitride layer 210.

The piezoelectric device 200 may be disposed on the cantilever 12 extending outward from the body part 11 of the substrate 10. For example, a proof mass 205 may be disposed on a bottom surface of the buffer layer 20. The proof mass 205 may be disposed on a distal end of the cantilever 12 facing the body part 11. The proof mass 205 may facilitate the vibration of the cantilever 12. The proof mass 205 may be formed by removing a portion of the substrate 10. Thus, the proof mass 205 may have the same material as the substrate 10. For example, the proof mass 205 may include one of sapphire, silicon, gallium nitride (GaN), and silicon carbide (SiC).

An opened space 240 may be provided below the second lower nitride layer 210. The opened space 240 may be formed by removing a portion of the substrate 10. The opened space 240 may provide a space in which the cantilever (corresponding to the piezoelectric device 200) vibrates. Thus, the opened space 240 may have a height greater than an amplitude (±δ) at which the cantilever 12 vibrates. The height of the opened space 240 may be determined by the removed thickness of the substrate 10.

The second upper nitride layer 220 may be disposed on the second lower nitride layer 210. The second upper nitride layer 220 may form a heterojunction structure with the second lower nitride layer 210. The second upper nitride layer 220 may include aluminum gallium nitride (AlGaN). For example, the second upper nitride layer 220 may include nitride layer patterns exposing a portion of the second lower nitride layer 210. The second 2DEG layer 215 may be provided on only area on which the nitride layer patterns contact the second lower nitride layer 210. That is, the second 2DEG layer 215 may be discontinuously provided on an interface between the second lower nitride layer 210 and the nitride layer patterns in a first direction. The first direction may be a direction perpendicular to a direction that is directed from the second upper nitride layer 220 toward the second lower nitride layer 210.

The second cap layer 230 may be disposed on the second upper nitride layer 220. For example, the second cap layer 230 may be disposed on the nitride layer patterns. The second cap layer 230 may include gallium nitride (GaN), indium gallium nitride (InGaN), or aluminum nitride (AlN). The second cap layer 230 may be a single layer or a composite layer constituted by several kinds of layers. The second cap layer 230 may reduce leakage current through a surface of the second upper nitride layer 220. According to an embodiment, electrical insulation layers such as alumina ($Al_2O_3$), silicon oxide ($SiO_2$), silicon nitride ($Si_3N_4$) or hafnium oxide ($HfO_2$) may be additionally disposed on the second cap layer 230.

The passivation layer 400 may be disposed on the second cap layer 230 and between the nitride layer patterns and the second cap layers 230. Since the passivation layer 400 may be provided between the nitride layer patterns to electrically insulate the nitride layer patterns from each other.

The second electrode structure 250 may include a third electrode 260 and a fourth electrode 270. The third electrode 260 and the fourth electrode 270 may pass through the second upper nitride layer 220 to contact the second lower nitride layer 210. Since the second 2DEG layer 215 may be disposed on an interface between the second upper nitride layer 220 and the second lower nitride layer 210, the third electrode 260 and the fourth electrode 270 may directly contact the second 2DEG layer 215. The second 2DEG layer 215 may be connected to the second electrode structure 250 to function as an counter electrode for the piezoelectric transduction. The third electrodes 260 and the fourth electrodes 270 may be disposed to correspond to the second upper nitride layers (the nitride layer patterns) 220, which are patterned and divided in plurality, respectively. That is, one of the third electrode 260 or the fourth electrode 270 may be disposed on one of the nitride layer patterns, and the third electrodes 260 may be electrically insulated from the fourth electrodes 270 by the passivation layer 400 disposed between nitride layer patterns.

The third electrode 260 and the fourth electrode 270 may be ohmic electrodes ohmic-contacting the second 2DEG layer 215. For example, the third electrode 260 and the fourth electrode 270 may be alloys including at least one of nickel (Ni), gold (Au), aluminum (Al), titanium (Ti) or molybdenum (Mo). The third electrode 260 may have an end electrically connected to the diode device 100, and the fourth electrode 270 may have an end connected to an external circuit.

The third electrode 260 and the fourth electrode 270 may have third extension parts 265 and fourth extension parts 275, which are disposed on the passivation layer 400, respectively. The third extension parts 265 may extend toward the fourth electrode 270, and the fourth extension parts 275 may extend toward the third electrode 260. The third extension parts 265 and the fourth extension parts 275 may be alternately disposed in one direction. The third extension parts 265 and the fourth extension part 275 may be spaced apart from each other, respectively.

An isolation area 300 may be disposed between the diode device 100 and the piezoelectric device 200. The isolation area 300 may be an area recessed toward the substrate 10 on the first upper nitride layer 120 or the second upper nitride layer 220. The isolation area 300 may be formed through mesa-etching. The isolation area 300 may isolate the first upper nitride layer 120 from the second upper nitride layer 220 and isolate the first 2DEG layer 115 from the second 2DEG layer 215. Thus, the diode device 100 may be electrically insulated and spatially isolated from the piezoelectric device 200.

The passivation layer 400 may be disposed on the isolation area 300, and a connection pad 350 may be disposed on the passivation layer 400. The connection pad 350 may electrically connect the first electrode structure 150 to the second electrode structure 250. Particularly, the connection pad 350 may connect the second electrode 170 of the first electrode structure 150 to the third electrode 260 of the second electrode structure 250.

A peripheral isolation area 310 may be provided on edges of the first and second lower nitride layers 110 and 210 and the first and second upper nitride layers 120 and 220. The peripheral isolation area 310 may be an area recessed in a direction that is directed from the first and second upper nitride layers 120 and 220 to the first and second lower nitride layers 110 and 210. The peripheral isolation area 310 may be an area in which the first and second 2DEG layers 115 and 215, which are disposed around the interfaces between the first and second lower nitride layers 110 and 210 and the first and second upper nitride layers 120 and 220, are removed. Thus, the hybrid diode device 1 may be electrically insulated from other semiconductor devices.

According to an embodiment of the inventive concept, a change of strain may be applied to the second lower nitride layer 210 of the piezoelectric device 200 by environmental changes such as vibration and pressure variation. Since the second lower nitride layer 210 includes a piezoelectric material, electric energy may be generated by extension and contraction of the piezoelectric material. The generated electric energy may be transferred to the second electrode structure 250 through the second 2DEG layer 215, and the second electrode structure 250 may supply the electric energy to the diode device 100 through the first connection pad 350.

According to an embodiment of the inventive concept, the diode device 100 and the piezoelectric device 200 may be disposed on the one substrate 10. The hybrid diode device 1 may not supply electric energy supplied from an external power source, but may supply the electric energy generated from the piezoelectric device 200 to the diode device 100. Thus, in the hybrid diode device 1 according to an embodiment of the inventive concept, the self-power supply may be possible to reduce the number of processes for electrically connecting the power source to the diode device, thereby increasing energy conversion efficiency, enabling miniaturization, and reducing manufacturing cost of the hybrid diode device.

Figure 3:
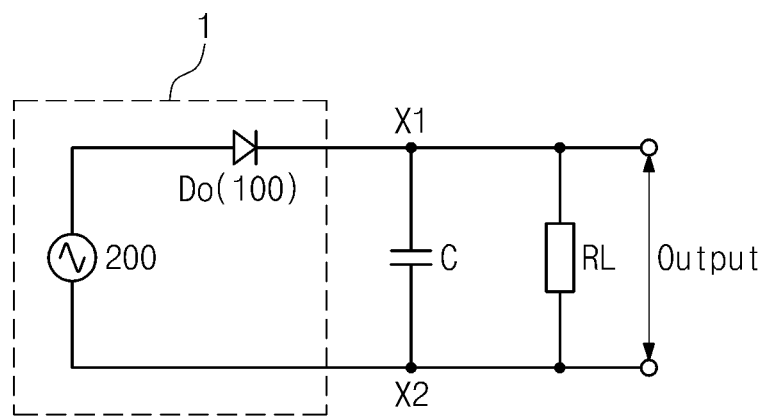
FIG. 3 is a circuit diagram of the hybrid diode device according to an embodiment of the inventive concept.

FIG. 3 is a circuit diagram of the hybrid diode device according to an embodiment of the inventive concept.

Referring to FIGS. 1 to 3, the piezoelectric device 200 may be an input power source generating electric energy, and the diode device 100 may be a half-wave rectification circuit which rectifies and converts the alternating current-type electric energy generated by the piezoelectric device 200 into the direct current type. The first electrode 160 which is the ohmic electrode and the second electrode 170 which is the Schottky electrode may form a Schottky diode Do. The first electrode 160 may have an end connected to a first point X1, and the fourth electrode 270 may have an end connected to a second point X2. An output terminal may be disposed between the first point X1 and the second point X2. Positive electric energy generated from the piezoelectric device 200 may pass through the Schottky diode Do and be applied to the output terminal. However, negative electric energy generated from the piezoelectric device 200 may not pass through the Schottky diode Do. Thus, the positive electric energy converted into the direct current by the diode device 100 may be transferred to the output terminal to supply the power to a capacitor C and a load $R_L$. Since the piezoelectric device 200 functioning as the input power source and the diode device 100 functioning as the rectification circuit are integrated on the substrate to from the hybrid diode device 1, the circuit may be minimized in whole size, and the number of electrical connection processes may be reduced to increase the energy conversion efficiency.

Figure 4:
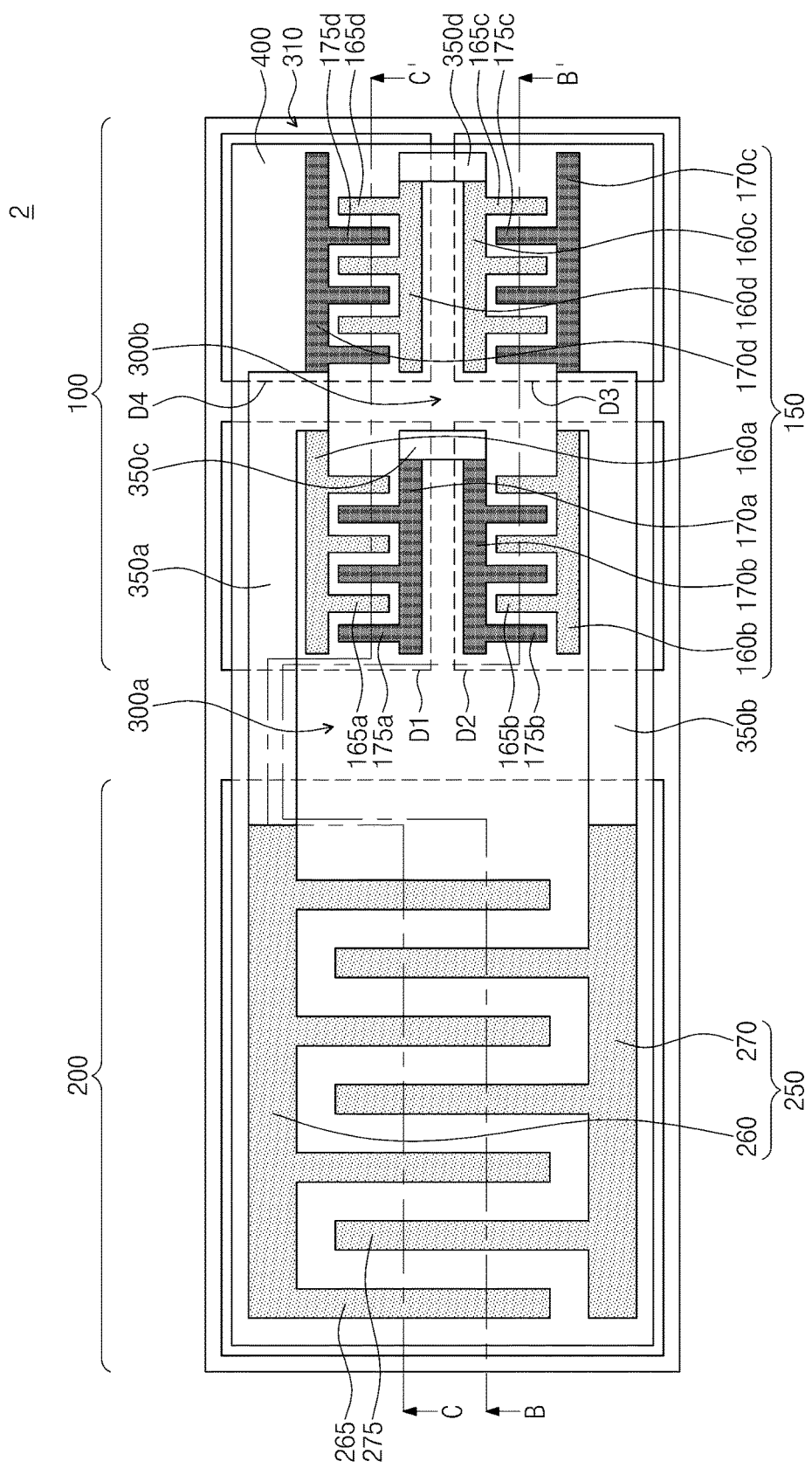
FIG. 4 is a plan view of a hybrid diode device according to an embodiment of the inventive concept.
Figure 5:
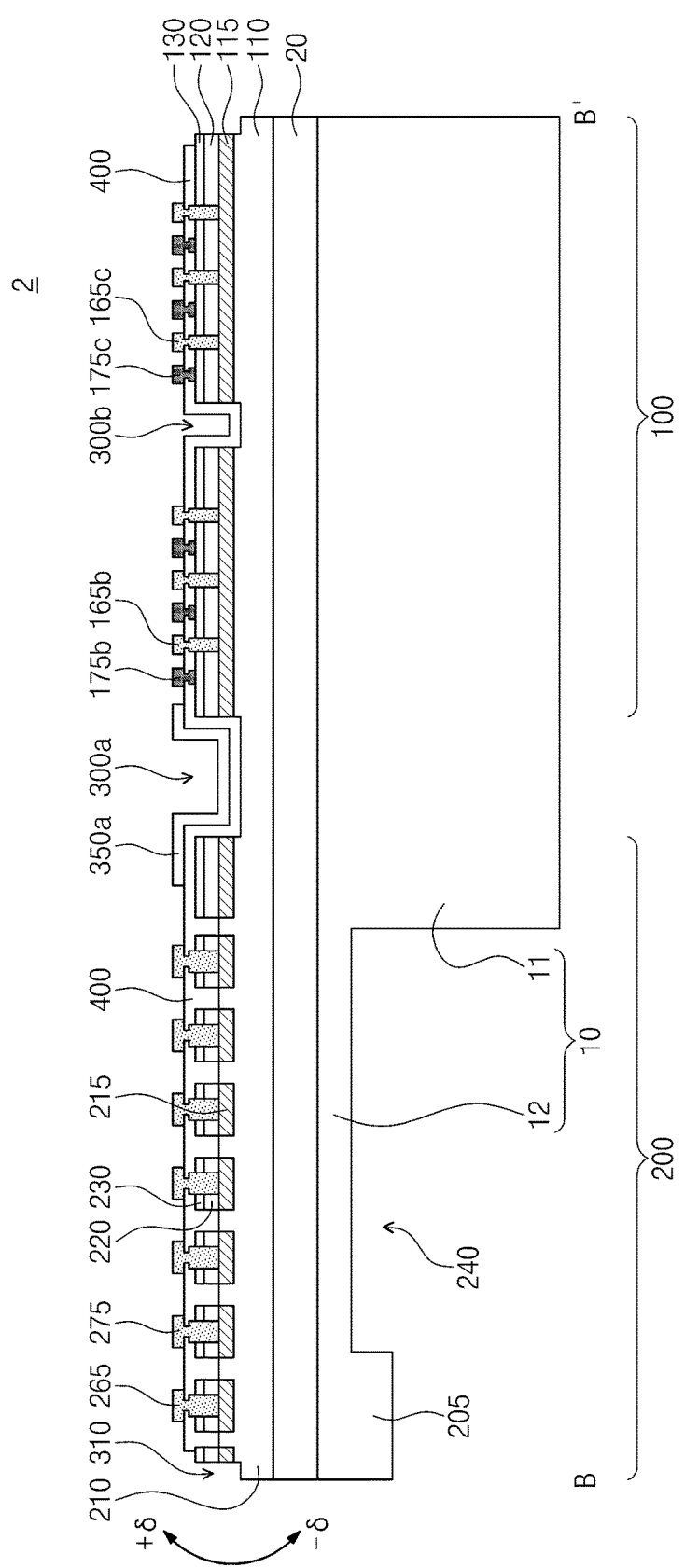
FIG. 5 is a cross-sectional view taken along line B-B' of FIG. 4.
Figure 6:
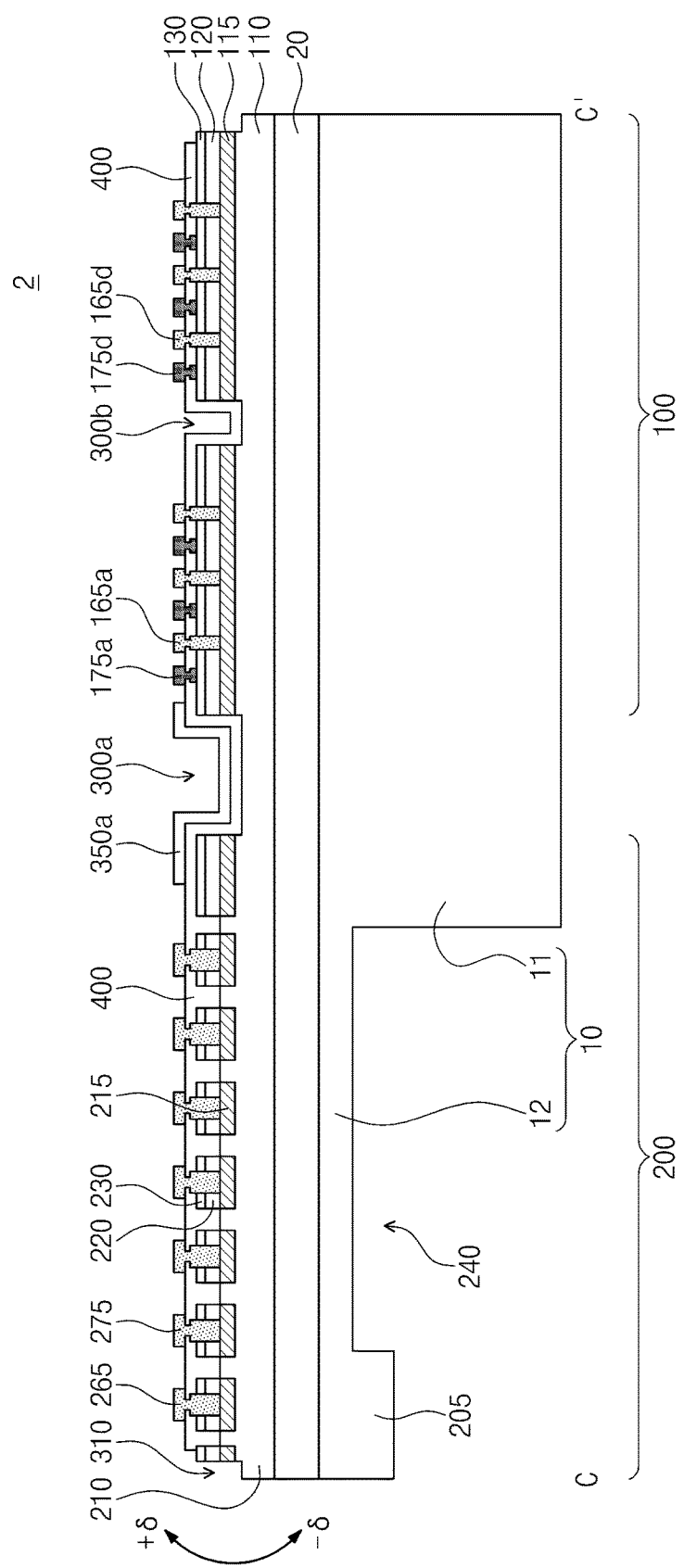
FIG. 6 is a cross-sectional view taken along line C-C' of FIG. 4.

FIG. 4 is a plan view of a hybrid diode device according to an embodiment of the inventive concept, FIG. 5 is a cross-sectional view taken along line B-B' of FIG. 4, and FIG. 6 is a cross-sectional view taken along line C-C' of FIG. 4. Descriptions duplicated with those of FIGS. 1 and 2 will be omitted for conciseness of description. Since descriptions with respect to the piezoelectric device 200 are the same as those the piezoelectric device of FIGS. 1 and 2, its description will be omitted.

Referring to FIGS. 4 to 6, a hybrid diode device 2 may include a diode device 100 and a piezoelectric device 200. The piezoelectric device 200 may generate electric energy by environmental changes such as vibration and pressure variation, and the diode device 100 may rectify and convert alternating current-type electric energy generated by the piezoelectric device 200 into direct current-type electric energy. For example, the diode device 100 may perform a full-wave rectification in which all the alternating current-type electric energy generated by the piezoelectric device 200 is converted into the direct current. The diode device 100 may be spatially isolated and electrically insulated from the piezoelectric device 200 by a first isolation area 300a. A first connection pad 350a and a second connection pad 350b may be disposed on the first isolation area 300a. The diode device 100 may be electrically connected to the piezoelectric device 200 by the first connection pad 350a and the second connection pad 350b. Also, the hybrid diode device 2 may be electrically insulated from other semiconductor devices through a peripheral isolation area 310. The detailed connection relationship will be described later.

The diode device 100 may include a second isolation area 300b that divides each of a first lower nitride layer 110, a first upper nitride layer 120, and a first cap layer 130 into four parts, respectively. The second isolation area 300b may be an area recessed from the first cap layer 130 toward the first lower nitride layer 110. That is, the second isolation area 300b may divide a first 2-dimensional electron gas (2DEG) layer 115 in the first lower nitride layer 110 into four parts. Accordingly, the divided first 2DEG layers 115 may be insulated from each other.

A first electrode structure 150 may be connected to the divided first 2DEG layers 115 and the cap layers 130 to from a bridge circuit. The first electrode structure 150 may include first electrodes 160a, 160b, 160c, and 160d which are ohmic electrodes and second electrodes 170a, 170b, 170c, and 170d which are Schottky electrodes. The first electrodes 160a, 160b, 160c, and 160d may pass through the first cap layer 130 and the first upper nitride layer 120 and be connected to the first 2DEG layer 115, and the second electrodes 170a, 170b, 170c, and 170d may be connected to the first cap layer 130. The first electrodes 160a, 160b, 160c, and 160d may include a first ohmic electrode 160a, a second ohmic electrode 160b, a third ohmic electrode 160c, and a fourth ohmic electrode 160d. The second electrodes 170a, 170b, 170c, and 170d may include a first Schottky electrode 170a, a second Schottky electrode 170b, a third Schottky electrode 170c, and a fourth Schottky electrode 170d. A pair of first ohmic electrode 160a and first Schottky electrode 170a, a pair of second ohmic electrode 160b and second Schottky electrode 170b, a pair of third ohmic electrode 160c and third Schottky electrode 170c, and a pair of fourth ohmic electrode 160d and fourth Schottky electrode 170d may constitute first to fourth diodes D1, D2, D3, and D4, respectively.

Each of the first electrodes 160a, 160b, 160c, and 160d and the second electrodes 170a, 170b, 170c, and 170d may have a plurality of extension parts spaced apart from each other on a passivation layer 400. The first ohmic electrode 160a may have first extension parts 165a, and the first Schottky electrode 170a may have second extension parts 175a. The first extension parts 165a may extend toward the first Schottky electrode 170a, and the second extension parts 175a may extend toward the first ohmic electrode 160a. The first extension parts 165a and the second extension parts 175a may be alternately disposed in one direction. The second ohmic electrode 160b may have third extension parts 165b, and the second Schottky electrode 170b may have fourth extension parts 175b. The third extension parts 165b may extend toward the second Schottky electrode 170b, and the fourth extension parts 175b may extend toward the second ohmic electrode 160b. The third extension parts 165b and the fourth extension parts 175b may be alternately disposed in one direction. The third ohmic electrode 160c may have fifth extension parts 165c, and the third Schottky electrode 170c may have sixth extension parts 175c. The fifth extension parts 165b may extend toward the third Schottky electrode 170c, and the sixth extension parts 175c may extend toward the third ohmic electrode 160c. The fifth extension parts 165c and the sixth extension parts 175c may be alternately disposed in one direction. The fourth ohmic electrode 160d may have seventh extension parts 165d, and the fourth Schottky electrode 170d may have eighth extension parts 175d. The seventh extension parts 165d may extend toward the fourth Schottky electrode 170d, and the eighth extension parts 175d may extend toward the fourth ohmic electrode 160d. The seventh extension parts 165d and the eighth extension parts 175d may be alternately disposed in one direction.

The first connection pad 350a, the second connection pad 350b, a third connection pad 350c, and a fourth connection pad 350d may connect the diode device 100 and the piezoelectric device 200 to the diodes D1, D2, D3, and D4. The first ohmic electrode 160a and the fourth Schottky electrode 170d may be connected to the first connection pad 350a and then electrically connected to a third electrode 260 of the piezoelectric device 200. The second ohmic electrode 160b and the third Schottky electrode 170c may be connected to the second connection pad 350b and then electrically connected to a fourth electrode 270 of the piezoelectric device 200. The first Schottky electrode 170a may be electrically connected to the second Schottky electrode 170b through the third connection pad 350c. The third ohmic electrode 160c may be electrically connected to the fourth ohmic electrode 160d through the fourth connection pad 350d. The third connection pad 350c and the fourth connection pad 350d may be connected to an external circuit.

According to an embodiment of the inventive concept, a change of strain may be applied to a second lower nitride layer 210 of the piezoelectric device 200 by environmental changes such as vibration and pressure variation. Since the second lower nitride layer 210 may include a piezoelectric material, electric energy may be generated by extension and contraction of the piezoelectric material. The generated electric energy may be transferred to a second electrode structure 250 through a second 2DEG layer 215, and the second electrode structure 250 may supply the electric energy to the diode device 100 by the first connection pad 350a and the second connection pad 350b.

According to an embodiment of the inventive concept, the diode device 100 which constitutes the bridge circuit and the piezoelectric device 200, may be disposed on a substrate 10.

Thus, the hybrid diode device 2 in which the diode device 100 is capable of converting the alternating current-type electric energy autonomously generated by the piezoelectric device 200 into the direct current type may be realized.

Figure 7:
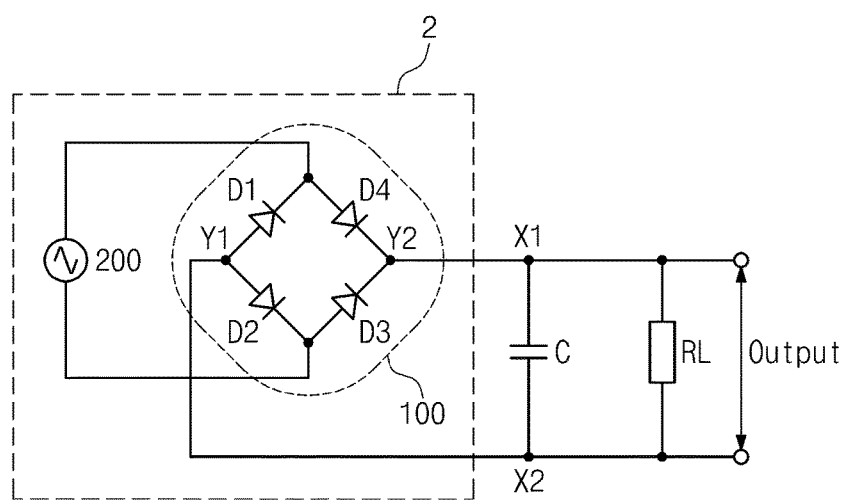
FIG. 7 is a circuit diagram of the hybrid diode device according to an embodiment of the inventive concept.

FIG. 7 is a circuit diagram of the hybrid diode device according to an embodiment of the inventive concept.

Referring to FIGS. 4 to 7, the piezoelectric device 200 may be an input power source generating electric energy, and the diode device 100 may be a full-wave rectification circuit which rectifies and converts the alternating current-type electric energy generated by the piezoelectric device 200 into the direct current type. The first ohmic electrode 160a and the first Schottky electrode 170a may constitute the first diode D1, the second ohmic electrode 160b and the second Schottky electrode 170b may constitute the second diode D2, the third ohmic electrode 160c and the third Schottky electrode 170c may constitute the third diode D3, and the fourth ohmic electrode 160d and the fourth Schottky electrode 170d may constitute the fourth diode D4. The fourth connection pad 350d may be connected to a first point X1, and the third connection pad 350c may be connected to a second point X2. An output terminal may be disposed between the first point X1 and the second point X2. When positive electric energy generated by the piezoelectric device 200 is applied to the diode device 100, the second diode D2 and the fourth diode D4 may be turned on to apply the positive electric energy to the output terminal. When negative electric energy generated by the piezoelectric device 200 is applied to the diode device 100, the first diode D1 and the third diode D3 may be turned on to apply the positive electric energy to the output terminal. Thus, when the piezoelectric device 200 may generate the alternating current-type electric energy, the diode device 100 may output the positive electric energy. The positive electric energy converted into the direct current by the diode device 100 may be transferred to the output terminal to supply the power to a capacitor C and a load $R_L$.

Unlike the described-above embodiment, the first to fourth diodes D1, D2, D3, and D4 in the diode device 100 may not limited in direction. However, the first to fourth diodes D1, D2, D3, and D4 may constitute the bridge circuit.

According to the embodiment of the inventive concept, the hybrid diode device in which the piezoelectric device and the diode device are integrated on the one substrate may be provided. Thus, the diode device may rectify the alternating current-type electric energy autonomously supplied by the piezoelectric device.

According to the embodiment of the inventive concept, the hybrid diode device may autonomously supply the power to reduce the number of processes for electrically connecting the power source to the diode device. Since the self-power providing piezoelectric device and the diode device that is the rectification conversion device are integrated on the one substrate, the hybrid diode device may be miniaturized and also decrease in manufacturing cost.

Although the embodiments of the inventive concept are described with reference to the accompanying drawings, those with ordinary skill in the technical field to which the inventive concept pertains will understand that the present disclosure can be carried out in other specific forms without changing the technical idea or essential features. Thus, the above-described embodiments are to be considered illustrative and not restrictive to all aspects.

What is claimed is:

1. A hybrid diode device comprising:
a first lower nitride layer disposed on a substrate and including a first 2-dimensional electron gas (2DEG) layer;
a second lower nitride layer extending from the first lower nitride layer to the outside of the substrate and including a second 2DEG layer;
a first upper nitride layer disposed on the first lower nitride layer;
a second upper nitride layer disposed on the second lower nitride layer;
a first cap layer disposed on the first upper nitride layer;
a second cap layer disposed on the second upper nitride layer;
a first electrode structure connected to the first lower nitride layer and the first cap layer; and
a second electrode structure connected to the second lower nitride layer and the first electrode structure,
wherein the second lower nitride layer generates electric energy through dynamic movement and supplies the generated electric energy to the first electrode structure via an electrical connection between the first electrode structure and the second electrode structure.

2. The hybrid diode device of claim 1, wherein the first 2DEG layer is spaced apart and electrically insulated from the second 2DEG layer.

3. The hybrid diode device of claim 1, wherein each of the first and second lower nitride layers comprise gallium nitride (GaN) as a gallium nitride-based material.

4. The hybrid diode device of claim 1, wherein each of the first and second upper nitrides comprise aluminum gallium nitride (AlGaN) as a gallium nitride-based material.

5. The hybrid diode device of claim 1, wherein the first electrode structure comprises:
a first electrode electrically connected to the first 2DEG layer in the first lower nitride layer; and
a second electrode connected to the first cap layer,
wherein the second electrode structure comprises a third electrode and a fourth electrode, which are electrically connected to the second 2DEG layer in the second lower nitride layer.

6. The hybrid diode device of claim 5, wherein each of the first electrode, the third electrode, and the fourth electrode is an ohmic electrode, and
the second electrode is a Schottky electrode,
wherein the third electrode is connected to the second electrode through a connection pad, and
the first electrode and the fourth electrode are connected to an external circuit.

7. The hybrid diode device of claim 5, wherein the first electrode is an ohmic electrode that is provided in plurality, and
the second electrode is a Schottky electrode that is provided in plurality,
wherein the ohmic electrode that is provided in plurality and the Schottky electrode that is provided in plurality constitute a bridge circuit.

8. The hybrid diode device of claim 7, wherein the ohmic electrode that is provided in plurality comprises a first ohmic electrode, a second ohmic electrode, a third ohmic electrode, and a fourth ohmic electrode,
the Schottky electrode that is provided in plurality comprises a first Schottky electrode, a second Schottky electrode, a third Schottky electrode, and a fourth Schottky electrode, and a pair of the first ohmic electrode and the first Schottky electrode, a pair of the second ohmic electrode and the second Schottky electrode, a pair of the third ohmic electrode and the third Schottky electrode, and a pair of the fourth ohmic electrode and the fourth Schottky electrode constitute first to fourth diodes, respectively.

9. The hybrid diode device of claim 8, wherein an isolation area is provided between the first to fourth diodes to respectively divide the first to fourth diodes into from each other.

10. The hybrid diode device of claim 8, wherein the first diode and the fourth diode are connected to the third electrode through a first connection pad,
the second diode and the third diode are connected to the fourth electrode through a second connection pad, and
the first diode and the second diode, and the third diode and the fourth diode are connected to an external circuit through a third connection pad and a fourth connection pad, respectively.

11. A hybrid diode device comprising:
a first lower nitride layer disposed on a substrate and including a first 2-dimensional electron gas (2DEG) layer;
a second lower nitride layer extending from the first lower nitride layer to the outside of the substrate and including a second 2DEG layer;
a first upper nitride layer disposed on the first lower nitride layer;
a second upper nitride layer disposed on the second lower nitride layer;
a first cap layer disposed on the first upper nitride layer;
a second cap layer disposed on the second upper nitride layer;
a first electrode structure connected to the first lower nitride layer and the first cap layer; and
a second electrode structure connected to the second lower nitride layer and the first electrode structure,
wherein the second lower nitride layer generates electric energy through dynamic movement,
the second upper nitride layer comprises nitride layer patterns exposing a portion of the second lower nitride layer, and
the second 2DEG layer is provided on an area on which the second lower nitride layer contacts the nitride layer patterns.

12. The hybrid diode device of claim 11, wherein the second 2DEG layer is discontinuously provided on an interface between the second lower nitride layer and the second upper nitride layer in a first direction, and
the first direction is perpendicular to a direction that is directed from the second upper nitride layer toward the second lower nitride layer.

13. The hybrid diode device of claim 11, wherein the second electrode structure passes through each of the nitride layer patterns to contact the second 2DEG layer.

14. A hybrid diode device comprising:
a substrate comprising a body part and a cantilever;
a lower nitride layer disposed on the substrate and including a 2-dimensional electron gas (2DEG) layer;
an upper nitride layer disposed on the lower nitride layer;
a first isolation area configured to divide the 2DEG layer into a first 2DEG layer and a second 2DEG layer and divide the upper nitride layer into a first upper nitride layer and a second upper nitride layer;
a first electrode structure connected to the first 2DEG layer and the first upper nitride layer; and
a second electrode structure connected to the second 2DEG layer,
wherein the second 2DEG layer and the second upper nitride layer are disposed on the cantilever,
wherein the second electrode structure transfers electric energy, which is generated by a change of strain applied to the lower nitride layer, to the first electrode structure.

15. The hybrid diode device of claim 14, wherein the first isolation area is recessed from the upper nitride layer toward the lower nitride layer.

16. The hybrid diode device of claim 15, further comprising a connection pad disposed on the first isolation area,
wherein the connection pad connects the first electrode structure to the second electrode structure.

17. The hybrid diode device of claim 14, further comprising a second isolation area which is recessed from the first upper nitride layer toward the first 2DEG layer to divide each of the first 2DEG layer and the first upper nitride layer into four parts,
wherein the first electrode structure comprises a pair of an ohmic electrode and a Schottky electrode, which are respectively connected to the divided first 2DEG layers and the divided first upper nitride layers.

18. The hybrid diode device of claim 17, wherein the pair of the ohmic electrode and the Schottky electrode, which constitutes one diode, are provided in four, and
the pair of the ohmic electrode and the Schottky electrode provided in four constitute a bridge circuit.

19. The hybrid diode device of claim 14, further comprising a cap layer disposed on a top surface of the upper nitride layer,
wherein the cap layer is divided by the first isolation area.

20. The hybrid diode device of claim 14, further comprising a proof mass disposed on an edge of the cantilever facing the substrate,
wherein an opened space in which the cantilever is movable is provided below the cantilever.

* * * * *